(12) United States Patent
Chmelar

(10) Patent No.: US 7,827,509 B2
(45) Date of Patent: Nov. 2, 2010

(54) DIGITALLY OBTAINING CONTOURS OF FABRICATED POLYGONS

(75) Inventor: Erik Chmelar, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 1509 days.

(21) Appl. No.: 11/182,615

(22) Filed: Jul. 15, 2005

(65) Prior Publication Data

US 2007/0013695 A1   Jan. 18, 2007

(51) Int. Cl.
*G06F 17/50* (2006.01)
*G06F 9/45* (2006.01)
*G06F 11/00* (2006.01)
*G01R 31/28* (2006.01)

(52) U.S. Cl. ............... 716/4; 716/2; 716/3; 716/9; 716/19; 716/21; 714/726; 714/731; 714/742; 714/746

(58) Field of Classification Search ............ 716/2, 716/3, 4, 9, 19, 21; 430/5; 714/726, 731, 714/742, 746

See application file for complete search history.

(56) References Cited

U.S. PATENT DOCUMENTS

| | | | | |
|---|---|---|---|---|
| 6,167,555 | A * | 12/2000 | Lakos | 716/3 |
| 6,174,741 | B1 * | 1/2001 | Hansch et al. | 438/14 |
| 6,625,611 | B1 * | 9/2003 | Teig et al. | 1/1 |
| 6,711,732 | B1 * | 3/2004 | Dai et al. | 716/19 |
| 6,886,153 | B1 * | 4/2005 | Bevis | 716/19 |
| 6,996,793 | B1 * | 2/2006 | Kronmiller et al. | 716/9 |
| 7,206,983 | B2 * | 4/2007 | Alyamani et al. | 714/729 |
| 7,269,816 | B2 * | 9/2007 | Bevis | 716/19 |
| 7,549,142 | B2 * | 6/2009 | Alvarez-Gomariz et al. | 716/21 |
| 2008/0206905 | A1 * | 8/2008 | Schaller et al. | 438/16 |
| 2009/0218600 | A1 * | 9/2009 | Park et al. | 257/202 |

OTHER PUBLICATIONS

Mah et al.; "Quantitative analysis of mask misalignment and its effect on device performance"; Publication Year: 1990; Gallium Arsenide Integrated Circuit (GaAs IC) Symposium, 1990. Technical Digest 1990., 12th Annual; pp. 313-315.*

* cited by examiner

*Primary Examiner*—Helen Rossoshek
(74) *Attorney, Agent, or Firm*—Suiter Swantz pc llo

(57) ABSTRACT

The present invention provides a method for digitally obtaining contours of fabricated polygons. A GDS polygon described in a Geographic Data System (GDS) file is provided. Based on the GDS polygon, a plurality of identical polygons is fabricated with the same fabrication process such that shapes of the plurality of identical polygons are altered by optical effects in the same or similar way. The plurality of identical polygons forms poly-silicon gates of a plurality of test transistors. The position of source and drain islands along a length of a poly-silicon gate for each of the plurality of test transistors is different. Using Automated Test Equipment (ATE), a digital test is performed on a circuit including the plurality of test transistors to obtain test responses, the test responses being raw digital data. The test responses may be displayed in a histogram reflecting a contour of the plurality of identical polygons or post-processed to reconstruct a contour of the plurality of identical polygons.

6 Claims, 7 Drawing Sheets

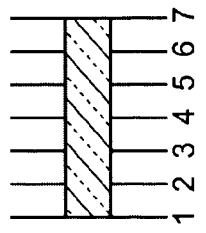
FIG._1A
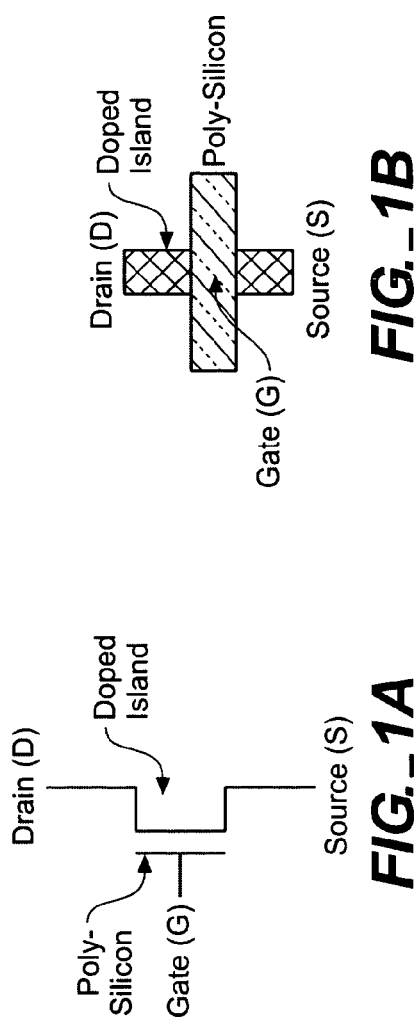
FIG._1B
FIG._2B
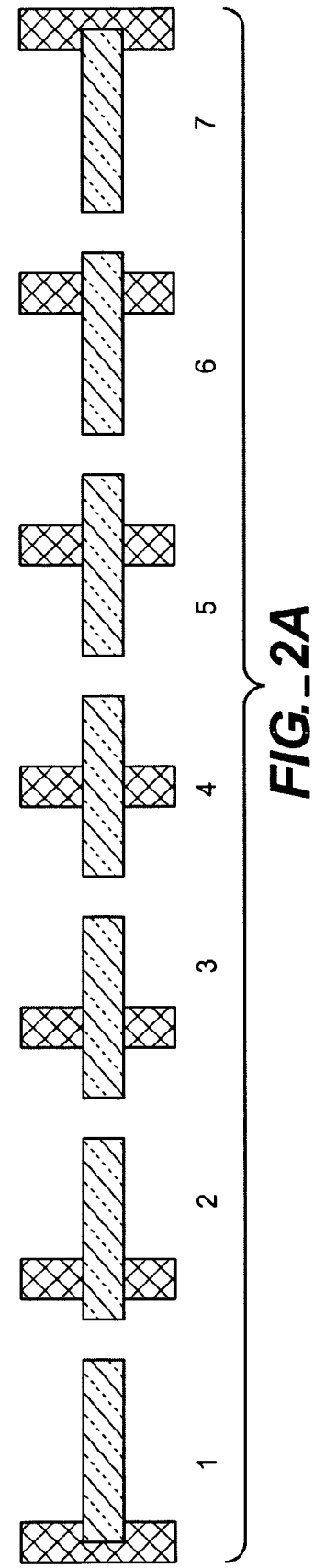
FIG._2A

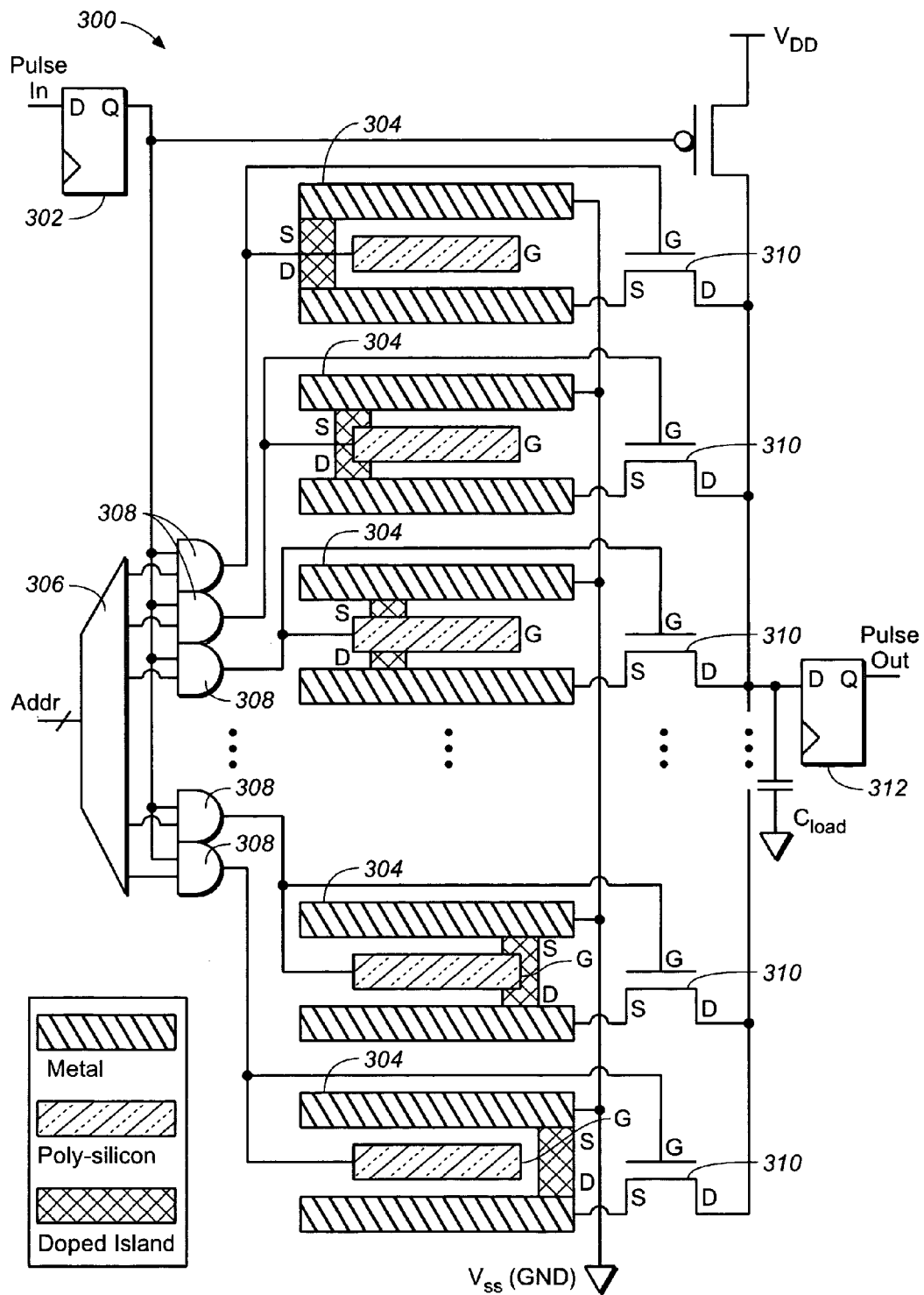
FIG._3

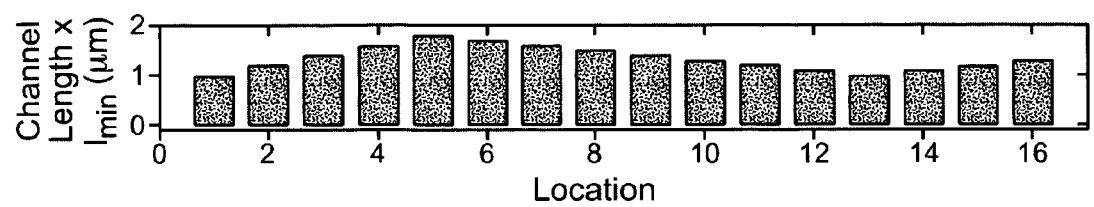
FIG._4A
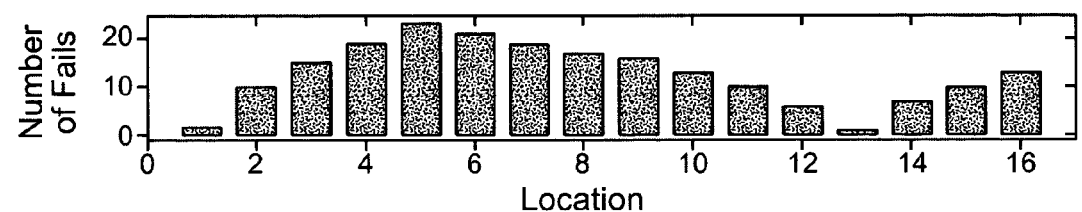
FIG._5

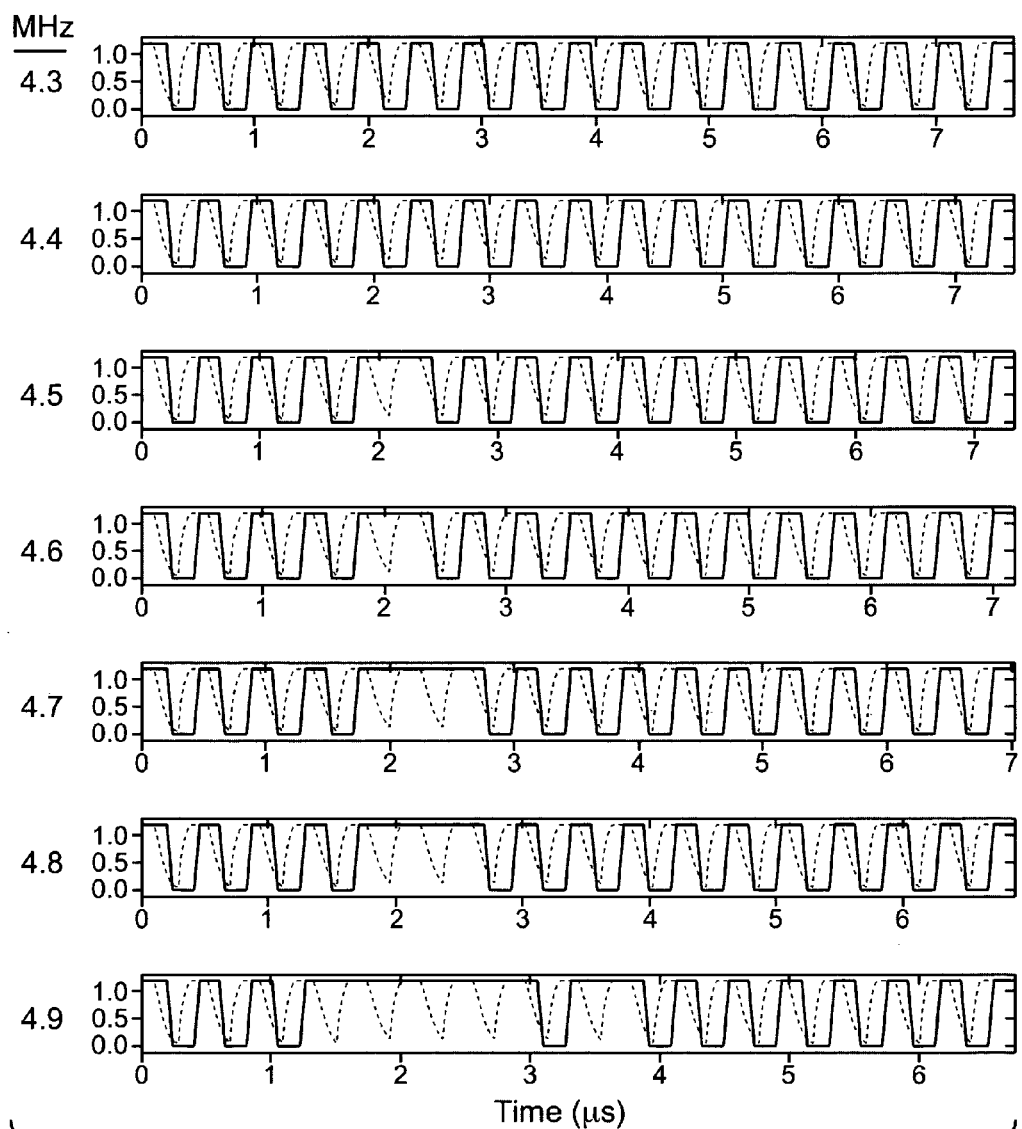
FIG._4B

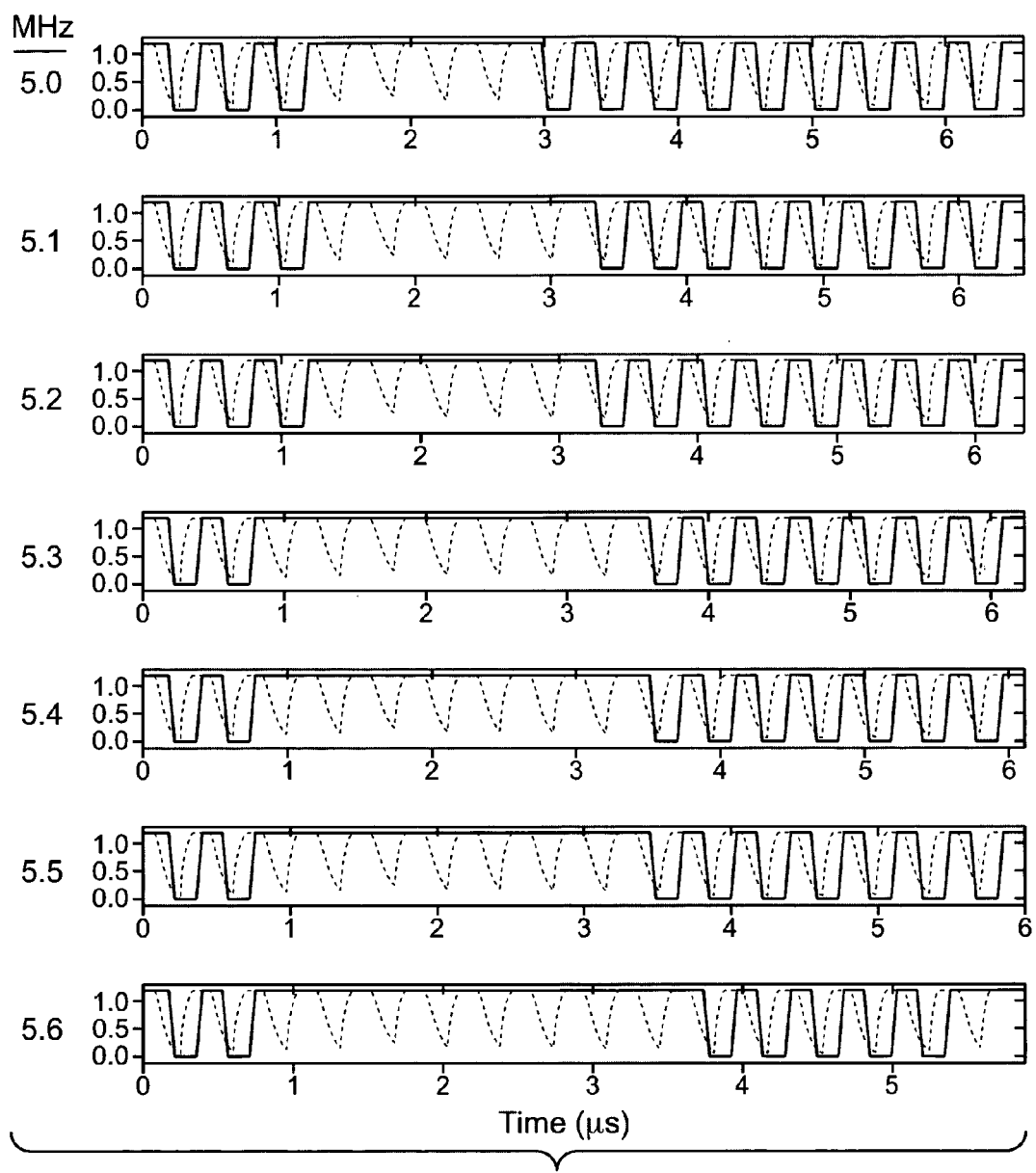
FIG._4C

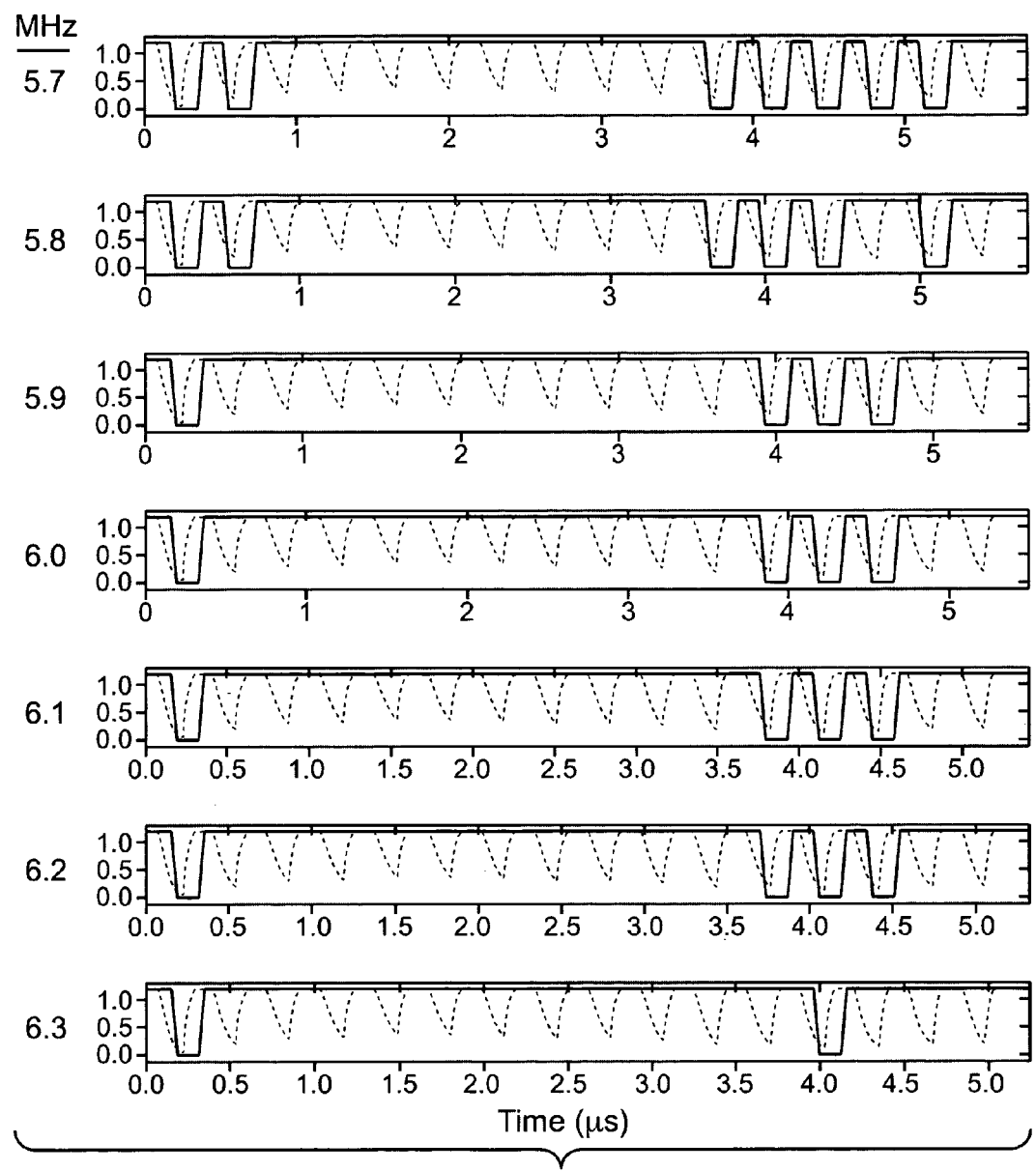
FIG._4D

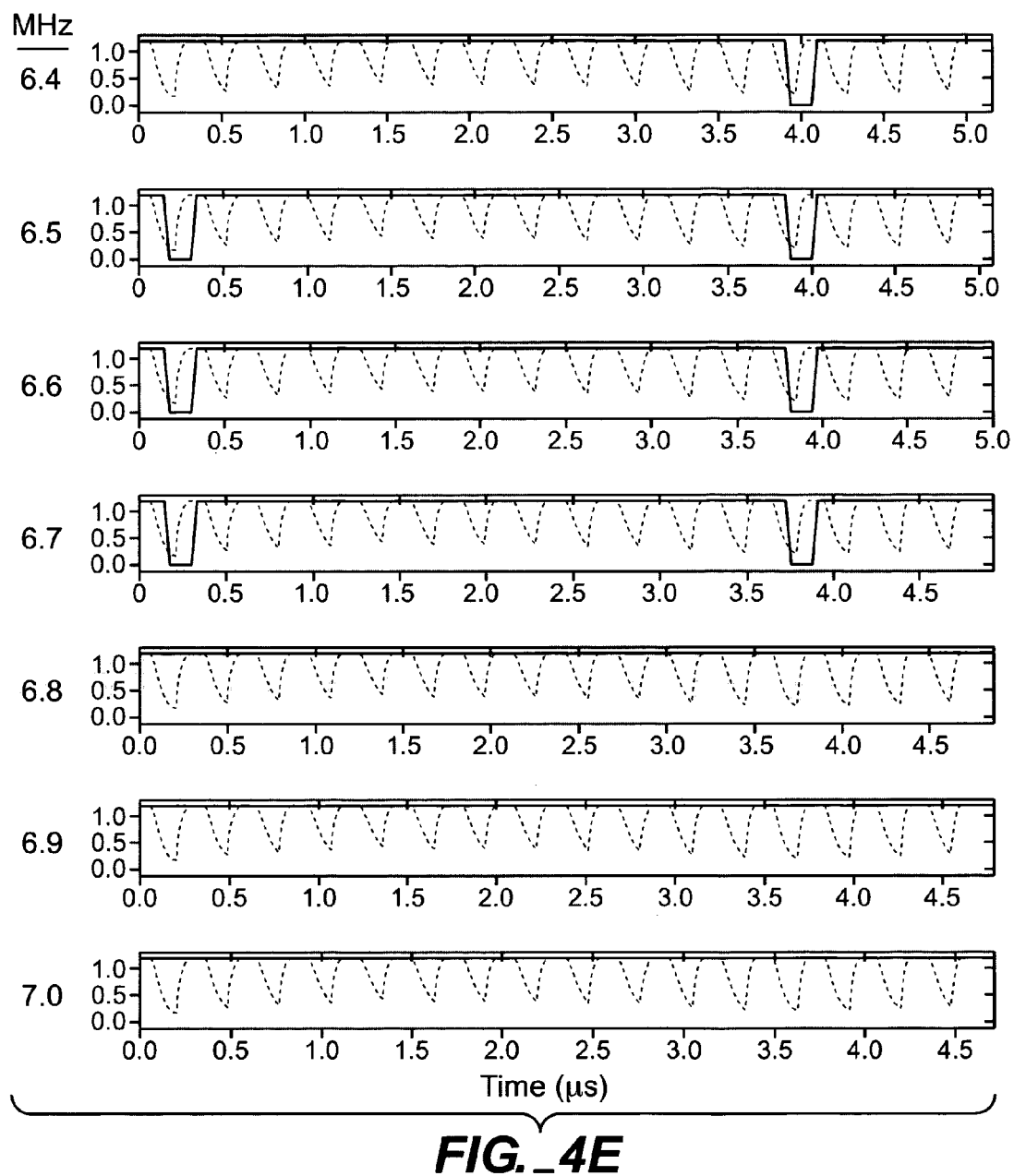
FIG._4E

DIGITALLY OBTAINING CONTOURS OF FABRICATED POLYGONS

FIELD OF THE INVENTION

The present invention generally relates to the field of integrated circuits, particularly to a system, method and computer-readable medium of digitally obtaining contours of fabricated polygons.

BACKGROUND OF THE INVENTION

As dimensions of fabricated polygons of semiconductors continue to shrink, it is becoming very difficult to produce regular, rectangular polygons because refraction and other optical effects may alter the expected shape of a polygon. In the past, with an in-house fab, a semiconductor vendor was able to obtain Scanning Electron Microscope (SEM) pictures of fabricated polygons for the purpose of calibrating an aerial image simulator so that the fabrication process may be characterized and the contours of fabricated polygons may be predicted by simulation. However, as the semiconductor vendors are becoming fabless, such SEM calibration data is extremely expensive, if obtainable at all. Without such calibration data, aggressive scaling in a particular process technology often results in low yields, costing the vendors lots of money. On the other hand, if the process technology is not used to its full potential (non-aggressive scaling), then the resulting fabricated chips may be large and have poor performance.

There are many known problems that make it difficult to reliably fabricate the polygons of a semiconductor to create a functioning chip. It has become common practice to perform Optical Proximity Correction (OPC) on the polygons described in a Geographic Data System (GDS) file. Essentially, OPC alters the GDS polygons based on a function $f^{-1}(x)$ that is the inverse of the function $f(x)$ which describes the fabrication process, such that when the a particular OPC'ed polygon is fabricated, the resulting contour closely resembles that described in the GDS file. A common example is adding "hammerheads" to a polygon to prevent "line-end shortening," a phenomenon wherein the length of a polygon is severely truncated due to refractive and other optical effects during fabrication.

However, OPC does not result in fabricated polygons that always closely resemble their respective GDS descriptions. Thus, margins are placed in the design rules to account for these discrepancies, resulting in a set of rules that do not permit the capabilities of a particular process technology to be fully utilized.

To be competitive in the marketplace, it is very important to be able to fine tune the design rules to reduce as much of the margins as possible. For a fabless company, however, this is almost impossible due to the lack of fabrication data.

Thus, it is desirable to be able to characterize the fabrication process of a particular process technology without relying on the very expensive or even impossible-to-acquire SEM data, and to provide a solution wherein a fabless company may optimize design layouts based on more finely tuned design rules by characterizing the fabrication process without requiring SEM or other analog data measurements.

SUMMARY OF THE INVENTION

In an exemplary aspect, the present invention provides a method for digitally obtaining contours of fabricated polygons. A GDS polygon described in a Geographic Data System (GDS) file is provided. Based on the GDS polygon, a plurality of identical polygons is fabricated with the same fabrication process such that shapes of the plurality of identical polygons are altered by optical effects in the same or similar way. The plurality of identical polygons forms poly-silicon gates of a plurality of test transistors. The position of source and drain islands along a length of a poly-silicon gate for each of the plurality of test transistors is different. Using Automated Test Equipment (ATE), a digital test is performed on a circuit including the plurality of test transistors to obtain test responses, the test responses being raw digital data. Depending on the type of circuit or circuits that include the plurality of test transistors, the test responses may be displayed in a histogram reflecting the number of times each of the plurality of test transistors passes or fails a particular test, displayed in a graph reflecting the frequency at which a particular circuit oscillates, or post-processed to reconstruct the contour of one of the plurality of identical polygons.

In an additional exemplary aspect of the present invention, several systems or circuits that use "polygon scanning" to map the contour of a polygon are provided. In one such circuit, a first flip-flop is placed at the beginning of the circuit that launches a pulse in synchronization with the clock. The circuit includes a plurality of identical polygons, based on a GDS polygon described in a Geographic Data System (GDS) file, fabricated such that shapes of the plurality of identical polygons are altered by optical effects in the same or similar way. The plurality of identical polygons forms a plurality of poly-silicon gates of a plurality of test transistors. The source of each test transistor is connected to $V_{SS}$ (GND). A decoder is placed at the beginning of the circuit to select one and only one of the test transistors. At each decoder output is an AND gate, which gates the activation of the selected test transistor by the output value of the first flip-flop. The drain of each test transistor is connected to the source of an isolation transistor to isolate each test transistor from the others, which may be necessary if a self-aligned fabrication process is used due to the resulting short channel effects that may occur in a test transistor that has an extremely short or no channel. Additionally, the gates of a given test transistor and its respective isolation transistor are connected, such that when the test transistor is activated, the isolation transistor is also activated. The drains of all isolation transistors are tied together and drive a load $C_{load}$, which is charged to $V_{DD}$ when no test transistor is active and discharged through one of the test transistors when a test transistor is activated. Finally, a second flip-flop is placed at the end of the circuit to capture the response of the circuit at the next clock cycle. Based on the channel length of an activated test transistor, which depends on its location along the particular polygon that forms its gate, the input to the second flip-flop may be pulled low (towards logic-0) at a rate proportional to its channel current. If the channel length is short, the input to the second flip-flop may be pulled down quickly; if the channel length is long, the input to the second flip-flop may be pulled down slowly. Alternatively, a second system that may use "polygon scanning" to map the contour of a polygon is a system of ring oscillator circuits. A particular ring oscillator is composed of a plurality of identical test transistors, formed by a plurality of identical polygons comprising the poly-silicon gate of each test transistor. The source and drain regions of each test transistor within a gate element of the ring oscillator (a typical gate element for a ring oscillator is an invertor) are placed at the same location along each poly-silicon gate (each identical polygon); thus, the channel length for each test transistor may be statistically similar, the transistor may function similarly, and the ring oscillator may oscillate at some frequency $f_i$. A polygon is therefore scanned by creating at least one ring oscillator for each desired location of the source and drain regions along each of those identical polygons. The location of the source and drain regions along each of the identical polygons in a particular ring oscillator determines the oscillation frequency of that ring oscillator.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1A depicts a schematic transistor;

FIG. 1B depicts a layout transistor;

FIG. 2A is a schematic diagram illustrating multiple transistors in accordance with an exemplary embodiment of the present invention;

FIG. 2B shows scanning effect resulted from the multiple transistors shown in FIG. 2A;

FIG. 3 shows a system or circuit for digitally obtaining contours of fabricated polygons in accordance with an exemplary embodiment of the present invention;

FIG. 4A is a schematic diagram illustrating an HSPICE-simulated polygon contour in accordance with an exemplary embodiment of the present invention;

FIGS. 4B through 4E show circuit responses at various test frequencies in accordance with an exemplary embodiment of the present invention; and FIG. 5 shows a simple histogram in accordance with an exemplary embodiment of the present invention.

DETAILED DESCRIPTION OF THE INVENTION

Reference will now be made in detail to the presently preferred embodiments of the invention, examples of which are illustrated in the accompanying drawings.

As the semiconductor vendors are becoming fabless, the fabrication data required to fine tune the design rules for a particular process technology to achieve high yields, high performance, and small-area designs is difficult, very expensive, or even impossible to obtain. The present invention provides a methodology to use inexpensive Automated Test Equipment (ATE) tests to obtain this data by mapping the contours of selected fabricated polygons.

One of the least expensive methods to test a circuit is a simple digital test using ATE, wherein logical values are applied to the circuit and then the logical output values are observed and compared to the expected response. The present invention makes use of inexpensive ATE tests to map the contour of a fabricated polygon.

The present invention aims to map the contour of a given polygon, accomplished by fabricating several identical polygons. Each GDS polygon, which in the current embodiment of the present invention forms the poly-silicon gate of a transistor, is placed in an identical environment so that when fabricated, the same optical effects may alter the shape of each fabricated polygon in the same (or in a very similar) way. FIGS. 1A and 1B show the schematic and layout representations of a transistor, respectively. Note that although the polygons are shown as rectangles in the following figures, their actual contours after fabrication may not be rectangular.

In a self-aligned process, the poly-silicon gate forms the mask layer for the source and drain islands (doped silicon islands). The source and drain islands are placed at different locations along the length of each polygon whose contour is to be mapped. For example, assume 7 identical polygons are fabricated, each forming the poly-silicon gate of a transistor as shown in FIG. 2A. The source and drain islands for a first transistor are placed as far as possible to the left. The islands for a second transistor are placed slightly to the right of the position of the previous islands for the previous polygon, and so on, until islands are placed at the rightmost position about the last polygon. Such placement of the source and drain islands about each identical polygon is similar to creating a transistor at different locations about the same polygon, effectively scanning a single polygon from left to right, as shown in FIG. 2B.

For each transistor formed at each location along the scanned polygon, the channel length, formed by the poly-silicon gate (the polygon), varies (it is the contour of such a polygon that is to be mapped). The difference in the channel length for each transistor may directly affect its saturation current, which is to be exploited to map the polygon's contour. For example, the simple square-law transistor model is shown as follows:

$$i_D = \frac{\mu \varepsilon W}{t_{ox} L} \frac{(V_{GS} - V_t)^2}{2},$$

where $i_D$ is the saturation current, $\mu$ is the effective mobility, E is the dielectric permittivity, $t_{ox}$ is the oxide thickness, W and L are the channel width and length, respectively, $V_{GS}$ is the gate-to-source voltage, and $V_t$ is the threshold voltage. It can be seen that the saturation current $i_D$ is inversely proportional to the transistor's channel length L.

FIG. 3 shows an exemplary system or circuit 300 that uses this "polygon scanning" idea to map the contour of a polygon. All polygons are described in the same way in the Geographical Data System (GDS) and are placed in a similar environment in the circuit or system, such that that each polygon is essentially identical in shape and size because each is altered by optical effects during fabrication in the same or similar way. A first flip-flop 302 is placed at the beginning of the circuit 300 that launches a pulse in synchronization with the clock. The source of each test transistor 304 (shown in layout representation) is connected to $V_{SS}$ (GND). The identical polygons form poly-silicon gates of the test transistors 304. A decoder 306 is placed at the beginning of the circuit 300 to select one and only one of the test transistors 304. At each decoder output is an AND gate 308, which gates the activation of the selected test transistor 304 by the output value of the first flip-flop 302. The drain of each test transistor 304 is connected to the source of an isolation transistor 310 to isolate each test transistor 304 from the others, which may be necessary if a self-aligned fabrication process is used due to the resulting short channel effects that may occur in a test transistor that has an extremely short or no channel. Additionally, the gates of a given test transistor 304 and its corresponding isolation transistor 310 are connected so that when the test transistor 304 is activated, the corresponding isolation transistor 310 is also activated. The drains of all isolation transistors 310 are tied together and drive a load $C_{load}$, which is charged to $V_{DD}$ when no test transistor 304 is active and discharged through one of the test transistors 304 when a test transistor 304 is activated. A second flip-flop 312 is placed at the end of the circuit 300 to capture the response of the circuit 300 at the next clock cycle.

Based on the channel length L of an activated test transistor 304, which depends on its location along the particular polygon that forms its gate, the input to the second flip-flop 312 may be pulled low (towards logic-0) at a rate proportional to its saturation current $i_D$. If the channel length is short, the input to the second flip-flop 312 may be pulled down quickly; if the channel length is long, the input to the second flip-flop 312 may be pulled down slowly.

It is understood that the circuit 300 of FIG. 3 is intended as an example and not as an architectural limitation to the present invention. Those of ordinary skill in the art will appreciate that various combinations and arrangements may be employed without departing from the scope and spirit of the present invention. For example, a circuit including at least one ring oscillator may be used to utilize polygon scanning to map a contour. At least one ring oscillator may be created for each position of the source and drain regions along the polygon to be scanned. Each ring oscillator may include only polygons with the source drain region at position $x_i$. Thus, if there are 10 position needed to fully scan the polygon, there may be at least 10 ring oscillators: the first ring oscillator with the source and drain region at position $x_1$, the second ring oscillator with source and drain regions at position $x_2$, and so on. Then the ring oscillators may be simply let run, the ringing frequency of each may be measured, and the data may be post-processed.

To map the polygon's contour, the circuit 300 shown in FIG. 3 need be tested at several different clock frequencies. At each frequency, say $f_i$, each test transistor 304 is activated at the beginning of a first clock cycle and attempts to pull down the input to the second flip-flop 312 (the load capacitor $C_{load}$) to ground before the beginning of the next clock cycle. The second flip-flop 312 may capture a logic-0 value if its input is pulled sufficiently low within the clock cycle, and may capture a logic-1 value if its input is not pulled sufficiently low.

Thus, at each frequency and for each test transistor 304 that is activated, the input to the test circuit 300 is a logical value (an input pulse and an address that selects which test transistor 304 to activate) and the output from the test circuit 300 is a logical value (a logic-0 or logic-1). Additional logic elements may be added to the circuit 300 to stabilize the logical values (e.g., to add an additional flip-flop after the second flip-flop 312).

The circuit 300 shown in FIG. 3 was simulated with the LSI Logic Corp.'s GFLX technology process using HSPICE (H-Simulation Program with Integrated Circuits Emphasis) and tested according to the foregoing described test methodology (BSIM level 49 transistor models were used). The arbitrary polygon shape shown in FIG. 4A was selected, which was divided into 16 individual test transistors according to the foregoing described polygon scanning technique.

FIGS. 4B through 4E show the test results (circuit responses) of the circuit 300 shown in FIG. 3, where the dashed line in each waveform represents the voltage level at the input to the second flip-flop 312 and the solid line represents the voltage level at the output of the second flip-flop 312 ($V_{DD}$=1.2 V). The frequency at which the circuit 300 was tested was swept in 0.1 MHz increments from 4.3 MHz to 7.0 MHz.

FIG. 5 shows a simple histogram of the number of fails (the number of times a particular test transistor 304 did not pull down the input to the second flip-flop 312 to logic-0) when tested from 4.4 MHz to 6.8 MHz (4.3, 6.9, and 7.0 MHz test results provided no additional information). As shown, without any post-processing of the data (e.g., weighting each test transistor failure event by a function of the test frequency), the contour mapped out by the simple histogram shows a good correlation to the actual simulated contour shown in FIG. 4A.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magneto-optical disk, ROM, RAM, EPROM, EEPROM, magnetic or optical card, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A system for digitally obtaining contours of fabricated polygons, comprising:

a plurality of test transistors including a plurality of poly-silicon gates formed by a plurality of identical polygons, said plurality of identical polygons being fabricated, based on a GDS polygon described in a Geographic Data System (GDS) file, with a same fabrication process such that shapes of said plurality of identical polygons are altered by optical effects in a same or similar way, a position of source and drain islands along a length of a poly-silicon gate for each of said plurality of test transistors being different, sources of said plurality of test transistors being connected to ground;

a decoder for selecting one of said plurality of test transistors;

a first flip-flop, placed at a beginning of said system, for launching a pulse in synchronization with a clock;

a plurality of AND gates, each of said AND gates receiving a first input from said decoder and a second input from said first flip-flop and outputting a value to said poly-silicon gate of said each of said plurality of test transistors;

a plurality of isolation transistors, a source of each of said plurality of isolation transistors being connected to a drain of said each of said plurality of test transistors, a gate of said each of said plurality of isolation transistors being connected to said poly-silicon gate of said each of said plurality of test transistors, drains of said plurality of isolation transistors being tied together;

a load, connected to and driven by said drains of said plurality of isolation transistors, being charged to $V_{DD}$ when none of said plurality of test transistors is active and being discharged through one of said plurality of test transistors when said one of said plurality of test transistors is activated; and a second flip-flop, placed at an end of said system and connected to said load, for capturing a test response at a next clock cycle.

2. The system of claim 1, wherein said system is tested at a plurality of different clock frequencies.

3. The system of claim 1, wherein said test response is displayed in a histogram showing a number of times a particular test transistor is not able to pull down an input to said second flip-flop to logic-0, said histogram reflecting a contour of said plurality of identical polygons.

4. The system of claim 1, wherein said test response is post-processed to reconstruct a contour of said plurality of identical polygons.

5. The system of claim 4, wherein said post-processing comprises weighing each test transistor failure event by a function of a test frequency.

6. The method of claim 1, wherein said plurality of test transistors includes a test transistor whose source and drain islands are placed at one end of its poly-silicon gate along a length of said poly-silicon gate.

* * * * *